United States Patent [19]

Roessler

[11] 4,148,044
[45] Apr. 3, 1979

[54] N-CHANNEL MEMORY FIELD EFFECT TRANSISTOR

[75] Inventor: Bernward Roessler, Munich, Fed. Rep. of Germany

[73] Assignee: Siemens Aktiengesellschaft, Berlin & Munich, Fed. Rep. of Germany

[21] Appl. No.: 834,425

[22] Filed: Sep. 19, 1977

[30] Foreign Application Priority Data

Sep. 29, 1976 [DE] Fed. Rep. of Germany ....... 2643987

[51] Int. Cl.² ............................................. H01L 29/78
[52] U.S. Cl. ........................................ 357/23; 357/13; 357/41; 357/45; 357/59
[58] Field of Search ....................... 357/23, 13, 59, 41, 357/45

[56] References Cited

U.S. PATENT DOCUMENTS

| | | | |
|---|---|---|---|
| 3,881,180 | 4/1975 | Gosney | 357/13 |
| 3,919,711 | 11/1975 | Chou | 357/23 |
| 4,019,197 | 4/1977 | Lohstroh et al. | 357/59 |

Primary Examiner—Edward J. Wojciechowicz
Attorney, Agent, or Firm—Hill, Gross, Simpson, Van Santen, Steadman, Chiara & Simpson

[57] ABSTRACT

N-channel memory FET has only one erasing projection ("tongue") on the floating memory gate. The tongue covers a special transfer region in the substrate, insulated from drain and source. The erasing of the memory gate occurs via this transfer region. There is separation of transfer region potential and source/drain potential.

Applicable for erasible-programmable read only memory chips and, in particular, for program memories of miniature calculators.

7 Claims, 4 Drawing Figures

N-CHANNEL MEMORY FIELD EFFECT TRANSISTOR

CROSS REFERENCE TO RELATED APPLICATIONS

Cross reference is hereby made to applicant's copending related application, Ser. No. 750,860, filed Dec. 15, 1976, assigned to the same assignee as the present invention. Application Ser. No. 750,860 is a continuation of Ser. No. 674,682. The disclosure of said application, Ser. No. 750,860 is incorporated herein by reference.

INTRODUCTION

This invention relates to an n-channel memory FET (field effect transistor), and more particularly to one which has a floating memory gate surrounded on all sides by an insulator where the charging of the memory gate may be accomplished by transferring electrons strongly accelerated in their conductive channel which are heated up and which because of their heating up by means of an electric field acting in the source-drain channel overcome the energy threshold of the conductivity band and thereby get to the memory gate. Thus, the channel injection is made use of for programming, that is, charging the memory gate. The memory gate acts on the source-drain section in a manner inhibiting the source-drain current. A control gate is provided on an insulating layer covering the memory gate which acts capacitively on the memory gate. The control gate is provided with a terminal through which a control voltage may be applied.

The memory gate is conductively connected to a tongue formed of conductive material by which the charge stored in the memory can be discharged. The tongue covers at least a part of a semiconductor region and separated therefrom only by a thin insulating layer, and serves to discharge the memory gate when an appropriate control voltage is applied. The tongue serves in particular for combatting contamination of the insulating layer during the erasing, i.e., during discharge of the electrically floating memory gate.

The source and drain are formed in a substrate of one conductivity type semiconductive material and are of the opposite conductivity type. By applying an erase voltages between the control gate and the semiconductor region covered by the tongue, and possibly by additional simultaneous application of an avalanche breakdown voltage to the blocking pn-junction between substrate and the respective semiconductor region covered by the tongue, electrons previously stored in the memory gate will mainly flow to the respective semiconductor region, or heated-up holes are produced in the pn-junction loaded to avalanche breakdown, which holes are attracted by the control gate potential, and thereby also by the memory gate potential, penetrate the insulator to thus discharge the memory gate. During the erasing these discharge currents flow through other regions of the insulator than do the charging currents during programming. This application of different insulator regions for the discharge currents on the one hand, and for the charging currents on the other hand brought about by the relatively good constancy of the minimum erasing voltages and minimum programming voltages, keeps down contamination of the insulating layer of the memory gate.

The definition of source and drain corresponds here to the source-drain current direction during the programming. A "cover" between the tongue on the one hand, and the semiconductor region on the other hand is present if the spacing between tongue and the respective semiconductor region is so small that the tongue potential capacitively (i.e., by electrostatic induction), influences the near-to-tongue surface of this semiconductor region by electrostatic induction, and in particular the charge density there, or the avalanche breakdown voltage of a substrate-semiconductor region-pn-junction attached in tongue proximity.

In the past there has been disclosed a memory matrix which contains a single n-channel memory FET as a memory cell. The control gates of the individual n-channel memory FETs are connected linewise to one another via horizontal lines. The drains of the n-channel memory FETs are connected together columnwise via column lines. All sources of the n-channel memory FETs of the matrix are connected with one another and, in addition, are connected to the common switching point.

For erasing an n-channel memory FET attached in a matrix, at least two griggerings are simultaneously necessary, namely a first triggering via the control gate, i.e., in this matrix example likewise, as well as a second triggering via the semiconductor region serving for erasing, i.e., in this matrix example, via the sources matrix-wise or via the drains column-wise. At the intersection points triggered by both triggerings the n-channel memory FET attached there is erased or, respectively, at the various simultaneously doubly triggered intersection points, the various n-channel memory FETs respectively attached thereto are simultaneously erased. On the other hand, none of the n-channel memory FETs triggered only by one of the two triggerings is erased, because the potentials at the remaining terminals of these n-channel memory FETs prevent the erasing.

PRIOR ART

In German Published application No. 25 13 207, as well as in Luxemburg Patent No. 72 605, issued Aug. 21, 1975, it is indicated that, particularly in the case of n-channel memory FETs with an enhancement type channel region, instead of or besides the utilization of the avalanche breakdown voltage, i.e. of the avalanche effect, additional effects, in particular, the Fowler-Nordheim tunnel effect and the gate surface effect, can also be utilized for erasing the charged memory gate. For this purpose, a voltage of corresponding polarity and amplitude is to be applied between the control gate and that semiconductor region in the direction of which the discharge of the memory gate is to occur, see Luxemburg Pat. Nos. 72 683 and 72 684, issued on Sept. 29, 1975.

From U.S. Pat. No. 3,919,711, FIGS. 2 to 4, a memory FET of the enhancement type (preferably having a p-channel) is known which has a floating memory gate 20, surrounded on all sides by an insulator, but no control gate is employed. See column 2, lines 44 to 49. The channel region is nonconductive with a discharged memory gate, but conductive with a charged memory gate 20, compare column 6, lines 2 to 20. (The charging occurs, by means of the avalanche effect. Compare column 3, lines 27 to 44). This is also understandable, since, during reading the charged state is to be clearly differentiated from the discharged state, in which regard a control-gateless memory FET of the enhancement type, which has a non-connected channel region in the discharged memory gate state, must correspondingly have a conductive channel region in the charged memory gate state, since no sufficiently large differences otherwise exist during reading.

While the aforesaid Luxemburg Pat. No. 72 605 does disclose an n-channel memory FET, it is differently operated than that of the present invention. Its memory gate is negatively charged in the programmed state, instead of positively, in which regard channel injection is utilized for charging, instead of the avalanche effect. Thus, in the program state the channel region is either especially poorly conductive or is excessively blocked, since the negative memory gate charge acts on the source-drain section by means of electrostatic induction in a manner inhibiting the source-drain current. In addition, in the present invention, the starting point is an n-channel memory FET which additionally has a control gate which acts capacitively on the memory gate, and which has a significantly large capacitance toward the memory gate. As already described in the said Luxemburg Pat. No. 72 605, the control gate permits, in particular in programming and reading special modes of operation, the construction of memory matrices which contain only a single FET per memory cell, namely only the n-channel memory FET per memory cell. This is not possible with the control-gateless memory FET found in the aforesaid U.S. Patent. Furthermore, because the memory FET is conductive in the programmed state and non-conductive in the erased state which, therefore, requires a further controlled FET, in series for each memory cell.

The memory gate 20 of the memory FET shown in said U.S. Patent is thus negatively charged in the program state, since it is normal to have a p-channel. As soon as an n-channel was provided, the memory gate 20 would have to be positively charged in the programmed state according to column 5, lines 2 to 9, because no conductive n-channel would be formed otherwise.

This known memory FET is eraseable with electrical means. For that purpose, its memory gate 20 is connected to a conductive tongue 20', via which the discharge occurs, compare column 3, line 57 to column 4, line 1, as well as the abstract of this U.S. Patent. The tongue 20' does not cover one of the main section connection regions, i.e., neither the source nor the drain, but rather a special semiconductor region insulated therefrom; namely, the transfer region 23 which is attached away from source and drain. This transfer region 23 is provided with its own bias potential.

In discharging the memory gate 20, which has up until then been charged (negatively in the case of p-channel), is discharged via tongue 20' by means of the transfer region 23 in that the gate surface effect is utilized, compare column 4, lines 49 to 54, and/or the Fowler-Nordheim tunnel effect, compare column 3, lines 53 to 56, is utilized.

Since a p-channel is preferably used, the discharging of an n-channel memory FET is viewed only in passing, compare column 3, lines 50 to 52. According to that, this control-gateless n-channel memory FET, whose memory gate 20 was positively charged up to that point, is erased by positive voltage to source and/or drain. In this, the potential of the memory gate 20 which was namely already positive, in any case, is further shifted in a position direction, so that a discharge occurs via the grounded transfer region 23, compare column 3, line 45 to column 4, line 1. When there is a use of the Fowler-Nordheim tunnel effect, the discharged electrons flow from the transfer region 23 to the tongue 20'. In the process, a hole injection for the positive charging is not possible of the memory gate of a control-gateless n-channel memory FET by means of avalanche effect.

BRIEF SUMMARY OF THE INVENTION

In the present invention, the starting point is also an n-channel memory FET with a tongue serving for erasing and with a semiconductor region, corresponding to the transfer region 23 and serving for erasing. The present invention is equipped with a control gate and with a memory gate which is negatively chargeable by channel injection. The inventive n-channel memory FET has a different structure and a different mode of operation not only because of its control gate, but because of the channel injection and because of its negative charge in spite of n-channel. The tongue as well and the semiconductor region have other effects during erasing:

In the present invention, electrons flow from the tongue to the semiconductor region during the discharging of the memory gate, in case the Fowler-Nordheim tunnel effect is utilized. In addition, the voltage effectuating the erasing is applied between the control gate (for example, negative potential or ground potential) and the semiconductor region (for example, positive potential). Because the capacitance between control gate and memory gate is much greater than the capacitance between source and drain on the one hand, and memory gate on the other hand, the erase voltage, between control gate and semiconductor region can have especially small amplitudes, in which regard the channel between source and drain remains non-conductive even in the case of control gate potentials which are negative in comparison to the substrate potential. Such erase potentials which are negative in comparison to the substrate potential would be impossible at the n-doped source and at the n-doped drain of the n-channel memory FET known from the U.S. Patent, even if this known n-channel memory FET had a negatively charged memory gate in the program state, as with the present invention, the negative potentials at source and drain would namely cause the pn-junctions between the substrate on the one hand, and source and drain on the other hand to become permeable. Thus, as a result of such strongly negative erase potentials, the memory gate of the invention is erasable via the tongue, but not the memory gate of the known memory FET via its tongue. Thus, even if it were desired, completely against the teaching of this U.S. Patent, to negatively charge, as per the present invention, the memory gate of the known control-gateless memory FET, now equipped with n-channel instead of normally with p-channel, and as a result to operate it similarly to the inventive n-channel memory FET disadvantages would thus exist as a result of different effects.

The object of the present invention is to improve the above referred to known devices of the prior art. It is a further object to provide an improved n-channel memory FET requiring low operating voltages, in such a way that it can be erased, as necessary, directly by a control gate/semiconductor region voltage in a low contaminating way, in case it is used in a memory matrix. For erasing, there can be other potentials on the semiconductor region than on source and drain. The present invention thus permits an often desired freedom with regard to the lead-in of the potentials to source and drain during erasing. The invention particularly permits designing a per se 2-dimensionally constructed matrix- —which is programmed and read 2-dimensionally, in such a way that, during erasing, it is triggered on the one hand via the horizontal lines connected to the control gates, and on the other hand via a so-to-speak third dimension of the matrix. With the aid of the third dimension, it is possible to simultaneously erase memory cells here and there, or ones determined in other ways, i.e., to erase memory cells which are respectively not attached in a common column or in a common line, but rather according to a different pattern. Thus, the invention permits constructing a matrix in which in each case all second or all eighth memory cells of a matrix line are simultaneously erased. During erasing the invention thus permits, instead of the normal 2-dimensional triggering during erasing, for example, also allowing the kind of triggering which occurs between one of the two normal dimensions of the matrix and a so-to-speak third dimension.

Then, in case it is not used in a matrix but rather as an individual n-channel memory FET, the inventive n-channel memory FET is that additionally to be able also to be erased in a low contamination way to its semiconductor region. Other potentials can also be allowed at source and drain than at the semiconductor region. In the process, the inventive measure is to allow being able to dimension and operate the inventive n-channel memory FET as respectively required, in such a way that the avalanche effect and/or the Fowler-Nordheim tunnel effect and/or the gate surface effect is utilizable for erasing.

The invention thus has as its starting point the above indicated special n-channel memory FET. The accomplishment of the inventive objective is made possible in that the semiconductor region is formed by a transfer region insulated from the two main section connection regions.

An advantage already exists in a case in which only a single n-channel memory FET is attached in a circuit. The invention permits namely that the n-channel memory FET is erased toward the transfer region, where simultaneously potentials different from the transfer region potential are on the source and on the drain. This allows an especially large freedom in the dimensioning of the circuit.

However, in a case in which several inventive n-channel memory FETs are arranged in a matrix, particular advantages are achievable as well, which are now to be gone into more specifically: In the following, the temporarily constant or alterable potentials to be applied, for erasing, to the transfer region or, respectively, to the control gate are respectively briefly designated only with "transfer potential" or, respectively, "control gate potential". The simultaneous application of both potentials is necessary for erasing, namely the control gate potential on the one hand, as well as the transfer potential on the other hand. Potentials of such magnitude which can release no erasing effect in the pertinent n-channel memory FET, but rather can even prevent the erasing, are, for reasons of clarity, not mentioned in the following or are clearly designated as such.

The inventive n-channel memory FET can be erased in a low contamination way toward the transfer region via the tongue because the insulator region via which the charging of the memory gate occurs is different and far away from the insulator region via which the discharge of the memory gate occurs. As soon as the transfer potential and the control gate potential is applied to the inventive n-channel memory FET attached in a matrix, the erasing occurs toward the transfer region. Since the inventive n-channel memory FET, as well as the n-channel memory FET indicated in the aforesaid Luxemburg Pat. No. 72 605, is respectively contained in a matrix cell, for example in a memory cell of a memory matrix, and since the connections of the control gates among one another as well as the connections of the transfer regions among one another in this matrix can be produced largely independently of one another, i.e., largely as desired (in which regard the connections, for example of the control gates among one another can correspond to a horizontal line or column line, or in which regard these connections can also be produced in a different manner, i.e., neither linewise or columnwise), makes possible the inventive measure of respectively triggering another group of n-channel memory FETs and/or another number of n-channel memory FETs with the respective potentials for the purpose of erasing, i.e., of the discharging of the previously negatively charged memory gate.

Depending on the kind of connections produced, another group and/or another number of n-channel memory FETs can thus be respectively erased. Because of the possibility of respectively triggering another group and/or another number of n-channel memory FETs of a matrix with the erasing potentials, it is correspondingly possible to select certain ones of the n-channel memory FETs from the sum of all n-channel memory FETs for erasing. In particular, the control gate potential can be fed in via another matrix dimension than the transfer potential, for example via a matrix line. In particular, the latter can, for example, be fed in, as it were, via a third matrix dimension, i.e., according to a complicated pattern (for example, to each n-th FET, for example 2nd or 8th FET), if it is desired to provide not only a column-wise or line-wise wiring of the transfer regions, i.e., a triggering of the transfer regions via the second or first matrix dimension.

It is thus possible to simultaneously trigger a single n-channel memory FET or respectively certain groups of n-channel memory FETs or all n-channel memory FETs of the matrix by the selection of the wiring of the control gates and of the transfer regions. In that the control gate potential is applied, for example, via the first matrix dimension, to, for example, only one line of the matrix example, the following erasing possibilities in particular are in effect. The erasing of only a single bit (in the selected matrix example, in particular by means of column-wise wiring of the transfer regions), or the erasing of all bits of a word (in particular by line-wise wiring of the transfer regions) or the erasing of specific places, for example of the even-numbered places of this word (in particular by the connection of all transfer regions of even-numbered places among one another and simultaneously by the connection of all transfer regions of odd-numbered places among themselves).

By additionally applying the control gate potential to respectively several lines instead of only to a single line, uniform erasings occur in each of these lines, instead of such erasings occurring in only one single line.

THE DRAWINGS

A preferred embodiment of the invention is illustrated in the drawings, in which:

FIG. 1 schematically shows a wiring diagram of an n-channel memory FET; and

FIGS. 2 to 4 show various production stages of an integrated preferred embodiment of the present invention applied on a substrate carrier.

DETAILED DESCRIPTION OF PREFERRED EMBODIMENT

Figure 1:
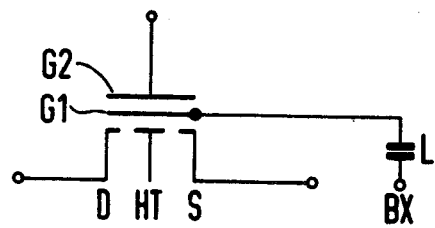

Before describing a preferred embodiment of the present invention in detail, reference will be made to the circuit shown in FIG. 1. An IGFET is shown having a floating memory gate G1 and a control gate G2. It is of the enhancement type. The drain and source are identified as D and S. The main section S-D of the n-channel memory FET is formed on a substrate HT. The memory gate G1 is surrounded on all sides by an insulator, and therefore is electrically floating. For charging the memory gate G1, channel injection, that is injecting electrons into the memory gate G1 and requiring especially low programming voltages, is made use of, so that after this charging, the memory gate acts, by means of its negative charge, by electrostatic induction, on the source-drain section S-D in a manner inhibiting the source-drain current. The additional control gate G2, controllable from the outside, is provided which acts capacitively on the memory gate G1. The memory gate G1 is connected to a conductive tongue L, via which the discharging of the memory gate G1 occurs during electrically controlled erasing. The tongue L covers a part of a special transfer region BX, which is insulated from the two connection regions S, D of the n-channel memory FET. The tongue L is separated from the transfer region by a thin insulating layer, for which reason it approximately corresponds to a capacitor coating.

For erasing, a voltage, which for example produces the Fowler-Nordheim tunnel effect, is applied between the control gate G2 on the one hand, and the transfer region BX on the other hand. Or, by means of this transfer region, the voltages which produce the other erasing effects are applied in per se known manner. The discharge of the memory gate then occurs via the tongue L in a low contaminating and low-loss manner. In particular, the Fowler-Nordheim tunnel effect permits erasing with relatively low control gate-transfer region voltages, with simultaneously especially low discharge currents.

Thus, in spite of the relatively great freedom in the selection of source and drain potentials during erasing, an n-channel memory FET is involved here which is generally operable with particularly low expenditure, namely with especially low voltages and low losses, also because of the utilization of channel injection for programming as well as because of the utilization, rather than the supportive effects on the source-drain current, of the inhibiting action in the charged state of the memory gate G1.

Additionally, the relevant n-channel memory FET is also easily producible, as is explained in the following with the aid of FIGS. 2 to 4. These figures show various production steps during the production of this kind of n-channel memory FET on a semiconductor, for example, on silicon substrate HT.

Figure 2:
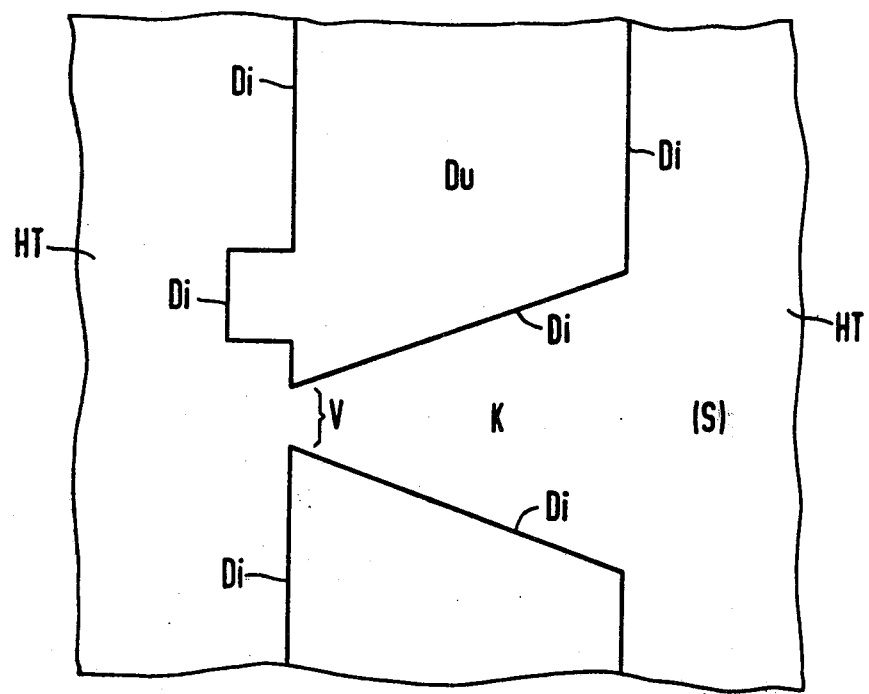
Figure 3:
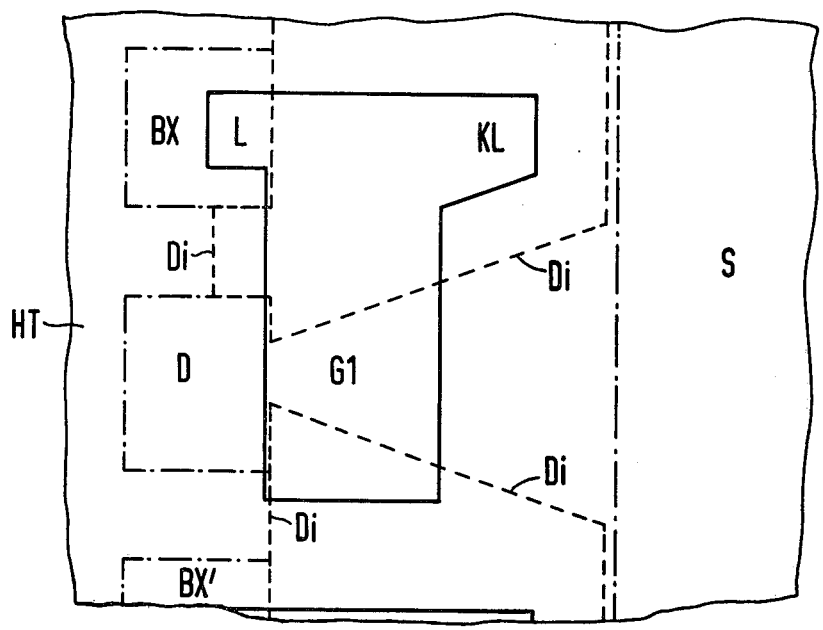

As shown in FIG. 2, it is possible to produce, for example, first the thick oxide layer Du of, for example, 10,000 Å thickness having the outlines Di, on the silicon substrate HT, with the channel region K continuing to be formed by the uncovered original surface of the silicon substrate HT. In the channel region K, compare FIG. 2, the thick oxide layer Du can produce a narrowing V near the later to be formed drain (D). This narrowing later facilitates the charging of the memory gate by means of channel injection, as is described in the aforesaid Luxemburg Pat. No. 72 605, which corresponds to German OS No. 24 45 079. Subsequently, a further oxide layer, namely a first thin oxide layer, of for example 1000 Å thickness can be caused to grow in the channel region K, over the entire body shown in FIG. 2, and this aforesaid oxide layer is later to separate in particular the channel region K from the memory gate G1, and it subsequently further increases the thickness of the thick oxide layer in the region Du.

Subsequently, a semiconductor layer, i.e., for example, 2,000 Å thick, n-doped polycrystalline silicon, can be made to grow on this first thin oxide layer. By means of subsequent etching it is possible at this time, compare FIG. 3 with FIG. 2, to produce the final form of the memory gate and the tongue L, which, together with the memory gate G1, forms a continuous conductive layer. In the region of the tongue L and of the channel region K, in this embodiment, this continuous conductive layer is in each case separated only by the thin oxide layer from the silicon substrate HT lying thereunder. In the remaining regions this continuous conductive layer is however at least largely separated by the thick oxide layer Du, compare FIG. 2, from the silicon substrate HT lying thereunder. The main-section connection regions source S and drain D shown in FIG. 3, as well as the transfer region BX and the transfer region BX' belonging to the adjacent n-channel memory FET, are not produced until a later production step. The only reason these regions are included in FIG. 3 is in order, in comparison with FIGS. 2 and 1, to be better able to recognize in FIG. 3 as well the later position of these regions shown in FIG. 4.

Subsequently, a second thin oxide layer of, for example, 1,000 Å thickness can be made to grow on the entire body shown in FIG. 3, which thin oxide layer is later to separate in particular the memory gate G1 from the control gate G2 applied above the memory gate G1 and shown in FIG. 1.

Subsequently, a further conductive layer, for example, of 2,000 Å thick polycrystalline silicon, can be made to grow on the second thin oxide layer. As shown in FIG. 4, the control gates G2 of several n-channel memory FETs are formed line-wise by a continuous control gate rail G2', which covers not only the memory gate G1, thus capacitively influencing it, but beyond that also covers further conductive parts KL of the conductive layer G1/L which is continuous with the memory gate G1, compare FIG. 3. In this way, the capacitive coupling between the memory gate G1, compare FIG. 1, and the control gate G2 or, respectively, between the memory gate G1, compare FIG. 4, and the control gate rail G2' is especially large, and as a result the necessary operating voltages are correspondingly particularly small, compare the cited Luxemburg Pat. No. 72 605 which corresponds to German OS No. 24 45 091.

Figure 4:
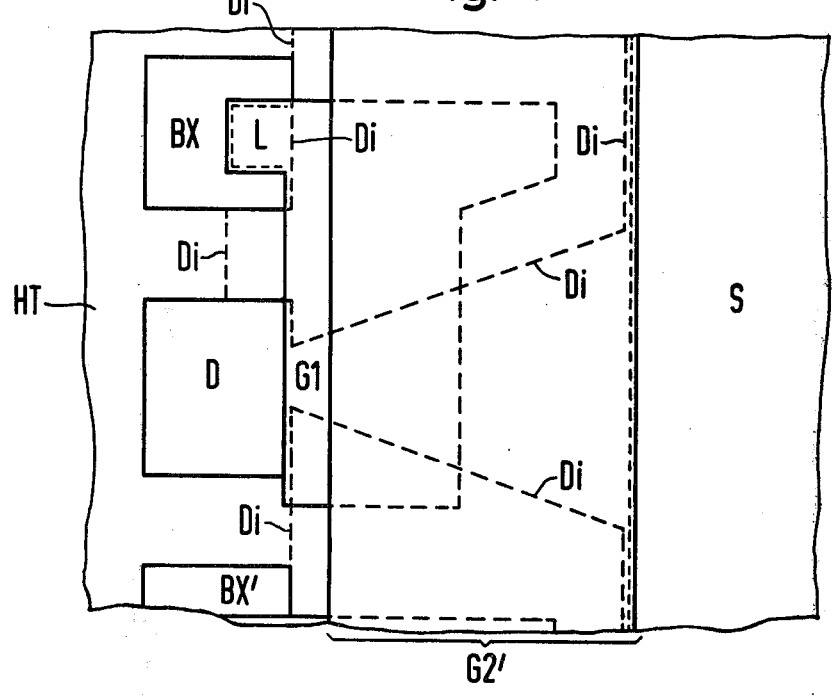

The outlines of the control gate rail G2' shown in FIG. 4, which in this example covers linewise the memory gates of further n-channel memory FETs as well, in particular of n-channel memory FETs belonging to the same line of the matrix, are formed from the last grown conductive layer, by etching away of all remaining parts of this layer. In the example shown in FIG. 4, it was assumed that, in this forming, the right edge of the control gate rail G2' approximately falls together with the right edges Di of the thick oxide layer Du; it was additionally assumed that the left edge of the control gate rail G2′, in particular as a result of adjustment tolerances, would lie somewhat to the right of the left edges Di of the thick oxide layer Du.

Subsequently, with the aid of ion implantation, the n-dopings of source S, drain D and transfer region BX can be produced, as well as a simultaneous n-doping of the control gate rail G2. For this purpose, donors, for example, phosphorus ions, can be implanted through the two applied thin oxide layers into the relevant substrate regions, S, D, BX at higher acceleration voltages, which can also correspond to more than 100 KeV, with the memory gate G1 and its tongue L in part serving as a mask for the limitation of the regions S, D and BX, and in part the right edge of the control gate rail G2′ serving as a mask. Instead of that, it would also be possible before implantation to first etch away the thin oxide layers, or at least the upper regions thereof, for example, the upper second thin oxide layer, laterally next to the control gate rail G2′, and carry out the implantation through the thinner remaining thin oxide layer, or, with complete etching away of the thin oxide layers, directly on the exposed substrate surface. The boundary Di of the thick oxide layer Du can also simultaneously act as a mask here, compare the outline of the transfer regions BX and BX′.

Instead of producing the n-dopings of S, D and BX with the aid of ion implantation, it is also possible to initially locally etch away the thin oxide layers over the respective regions S, D and BX and then subsequently diffuse donors into the then-exposed silicon substrate surfaces HT there. Here as well, the memory gate G1, together with its tongue L, as well as the control gate rail G2′, as well as the borders Di of the thick oxide layer Du can simultaneously be utilized as a mask for the etching away of the thin oxide layers.

Subsequently, the wirings of the various regions S, D, BX can still be produced. In the embodiment shown in FIG. 2, it is additionally assumed that the source S forms a continuous rail, which per se already electrically conductively connects together the sources S of several n-channel memory FETs which are emplaced in the same line, so that no additional wiring is necessary for this purpose.

Thus, although the inventive embodiment originally looks apparently as though it was complicated, it is nevertheless possible to produce this embodiment with few production steps, given even relatively large adjustment tolerances for the adjustment of the masks: in particular, the size of the narrowing V, compare FIG. 2, is already determined with great precision by the mask producing the thick oxide layer Du, since all thick oxide layers Du can be produced simultaneously with one and the same mask. The adjustment of the mask for the forming of the continuous conductive layer containing the memory gate G1 and the tongue L can occur with relatively large adjustment tolerance, since the shifting of this layer upward or downward, compare FIG. 4, as well as to the left or to the right as well is not critical to a relatively great extent. Of these four shifts, the shifting to the right alone still has the greatest significance, because the width of the narrowing V, compare FIG. 2, at the junction between drain D and channel region K becomes greater, and therefore the channel injection correspondingly requires a somewhat higher source-drain programming voltage or requires somewhat increased time periods for the complete programming of the memory gate, i.e., the charging of the memory gate. But this shift to the right is also relatively harmless at least because the drain D then reaches correspondingly far into the region of the thick oxide layer-narrowing V, after the memory gate G1 was utilized as a mask for the n-doping of the drain D. As a result, the channel injection will later always occur beneath the memory gate G1 at the drain-proximate pn-junction in the narrowing V, at least as long as the memory gate G1 acts as a mask there, instead of the control gate rail G2′.

Relatively large tolerances are also permissible for the adjustment of the mask forming the control gate rail G2′: A shifting upward or downward is irrelevant for this n-channel memory FET.

A shifting to the right is also harmless, at least as long as the tab L1 is not yet completely covered by the control gate rail G2′. The outlines of the source S are namely determined there by the control gate rail G2′, so that an erasing of the memory gate G1 is still possible via the tab L1, as long as the control gate rail G2′ does not completely cover the tab L1.

A shifting of the control gate rail G2′ to the left is also harmless, as long as the control gate rail G2′, as already mentioned, does not so greatly overlap memory gate G1 that the drain-channel region-junction is determined by the control gate rail G2′, instead of by the memory gate G1. Simultaneously, the outlines of the source S are, in the process, partially determined by the outlines Di of the thick oxide layer Du, compare FIG. 2; in the region of the channel region K, on the other hand, there are determined by the right edge of the control gate rail G2′.

Also the adjustment for the limiting of the drain D and of the transfer region BX is possible with relatively high tolerances: Both regions can be simultaneously n-doped with the aid of a mask, whether they are produced with the aid of ion implantation or with the aid of diffusion. A simultaneous shifting of these two regions D, BX upward or downward, as well as to the left or to the right is obviously permissible with relatively high tolerances, compare FIG. 4.

The wiring of the connection regions D, S and of the transfer regions BX, BX′ can, as already described, be done respectively in various ways. In particular, for example, the drain D of such n-channel memory FETs which are attached in a matrix can be connected column-wise with one another, compare the matrix example already indicated above. Simultaneously, as already mentioned, the transfer regions BX can be wired among themselves line-wise or column-wise as well, to be sure. Instead of that, these transfer regions BX can, however, also be wired together in a different manner instead of line-wise or column-wise, for example in such a way that, per 64 × 64 matrix with eight 8-bit-bytes per line, eight separate transfer region collection connections are provided, each collection connection of which is respectively connected only to a single transfer region BX of the total of eight transfer regions BX of each byte in each line. By the application of the control gate potential to the horizontal-line line, i.e., to the control gate rail G2′, and by simultaneous application of the transfer potential to one of the eight transfer region collection connections, it is possible in this case to respectively erase a certain one of the eight places in all eight bytes, or with the application of the transfer potential to all eight transfer region collection connections, all eight places of each of the eight bytes, of that line which controls this control gate rail G2′.

The free choice of the dimensions of the matric which the invention permits for the wiring of the transfer regions BX, by the way, also for sources S and for drains D, thus even allows triggering the sources, drains and/or the transfer regions BX in each case via dimensions of the matrix which correspond to neither the first nor the second matrix dimension. If, for example, the various control gate rails G2' respectively correspond to the first matrix dimensions, and if the drains D are respectively connected column-wise and thereby their connections thus correspond to the second matrix dimension, then, as already described in detail, the transfer regions BX can be wired together according to a completely different distribution principle, instead of column-wise or line-wise, and in this manner as it were a third dimension of the matrix can be utilized for triggering the transfer regions BX.

Previously a preferred embodiment was described in which the first thin oxide layer provided the insulator layer between the silicon substrate HT on the one hand and the tongue L on the other hand which is the same thickness as the insulator layer formed by this thin oxide layer between the substrate HT and the memory gate G1 in the channel region K. In principle, however, it is also possible to make the insulator layer separating the tongue from the substrate thinner than, the insulator layer separating the memory gate G1 from the channel region K1. The thinner the insulator layer between the tongue and the substrate is, the lower becomes the minimum erasing voltages which are to be fed in for the discharging of the memory gate by means of the Fowler-Nordheim tunnel effect.

In the preferred embodiment the memory gate covers only a first part of the channel region K, in contrast to which the second part of the channel region K is, to be sure, covered by the control gate rail G2' (see FIG. 4) or, respectively, by the control gate G2, but not by the memory gate G1. Because of this bipartition of the channel region K, an excessive erasing of the memory gate G1 is permissible, which is per se already known. As a result of the trapezoidal forming of this channel region, compare FIG. 2, the inherent resistance of the second part of the channel region with a conductive channel is especially low in comparison to the inherent resistance of the first part of the channel region. Even if the channel length between source and drain is relatively large, the inherent resistance of the second channel region section remains small and thus the source drain voltage necessary for programming is small. The drain-side narrowing V of this trapezoid can be simultaneously utilized as a channel inhomogeneity promoting channel injection.

If, however, the memory gate G1 is made to cover the entire channel region K between drain D and source S, smaller channel region lengths between source S and drain D can be permitted, without demanding impermissibly small adjustment tolerances for the production. The smaller the length of the channel region K is, the smaller the source drain programming voltage necessary for programming becomes. Also, the voltage requirement for reading between source S and drain D is smaller with a diminished channel length. With complete coverage of the channel region by the memory gate, erasing via the tongue L is also possible without contamination. A trapezoidal forming of the channel region is also favorable here; in this way, the channel-injection-promoting narrowing V or, respectively, channel inhomogeneity V is produced; on the other hand, the inherent resistance of the channel is relatively small in spite of this narrowing V, in comparison to a channel having only the width V overall.

It will be apparent to those skilled in the art that many modifications and variations may be effected without departing from the spirit and scope of the novel concepts of the present invention.

I claim as my invention:

1. An n-channel memory FET comprising a p-type semiconductor substrate having spaced drain and source regions of n+ conductivity type in one surface of said substrate, a channel region in said substrate between said source and drain regions, a third n+ region in said substrate spaced from said source, drain and channel regions, an insulating layer covering said substrate, a floating memory gate above said channel region between said source and drain being conductively connected to a single conductive tongue, said memory gate and said tongue being in said insulating layer completely surrounded by the insulating material of said insulating layer, said memory gate being located above said channel region, said single conductive tongue extending to a position above said third n+ region, said tongue being insulated from said third n+ region and from said source and said drain, a control gate on said memory gate separated therefrom by said insulating material, means for applying different electric potentials to said source and said drain, transfer of charges to said memory gate being by strongly accelerating charges in said channel region, namely by heating up said charges by a strong electric field acting in the source-drain direction, said charges thereby overcoming the energy threshold to the conductivity band due to a high positive bias on said control gate and on said drain with respect to said source, electrons are transferred to said memory gate by being accelerated in said channel region by being heated up by an electric field acting in a source-drain direction sufficiently to overcome the energy threshold to the conductivity band of said insulating layer, the charging of said memory gate occurring by the resulting channel injection, the resulting charge in said memory gate inhibiting the source-drain current, a control gate terminal for connection with the control voltage which when it is an erase voltage causes said control gate to act capacitively on said memory gate to cause said memory gate to be discharged through said conductive tongue to said third n+ region, the thickness of the insulation between said channel region and said memory gate being at least 100 Å.

2. An n-channel memory FET comprising a p-type semiconductor substrate having spaced drain and source regions of n+ conductivity type in one surface of said substrate, a channel region in said substrate between said source and drain regions, a third n+ region in said substrate spaced from said source, drain and channel regions, an insulating layer covering said substrate, a floating memory gate above said channel region between said source and drain being conductively connected to a single conductive tongue, said memory gate and said tongue being in said insulating layer completely surrounded by the insulating material of said insulating layer, said memory gate being located above said channel region, said single conductive tongue extending to a position above said third n+ region, said tongue being insulated from said third n+ region and from said source and said drain, a control gate on said memory gate separated therefrom by said insulating material, means for applying different electric potentials to said source and said drain, transfer of charges to said memory gate being by strongly accelerating charges in said channel region, namely by heating up said charges by a strong electric field acting in the source-drain direction, said charges thereby overcoming the energy threshold to the conductivity band of the insulation material, and thereby cause the injection of said charges into said memory gate, whereby, after this charging acting upon said channel region by electrostatic induction, influencing the source-drain current, said control gate acting capacitively on said memory gate, said memory gate being discharged via said tongue to a semiconductor region separated from said source and from said drain during electrically controlled erasing, the tongue covering at least a part of said semiconductor region for discharge of said memory gate when an erase voltage is applied between said control gate and said semiconductor region, said tongue being separated by a thin insulating layer from the semiconductor region covered by it, the thickness of said insulating layer between said channel region and said memory gate being at least 100 Å.

3. An n-channel FET matrix memory comprising a semiconductor substrate of p-type conductivity having a single source rail of n+ conductivity type, a plurality of drains of n+ conductivity type spaced from each other in a row which extends parallel to said source rail, channel regions in said substrate between said source and drain regions, a thick oxide layer covering one surface of said substrate except for said drains, for said source rail and for third n+ regions, and except for portions of said oxide layer above said channel regions between each of said drains and said source rail, whereby said oxide layer is thin, thereby providing an enhancement type channel region between each of said drains and said source rail, said third n+ type regions being provided for each of said drains to be located in the same row as said drains, said third n+ regions being spaced from said drains, separate floating memory gates above the drain side portions of said channel regions, respectively, and lying above said channel regions, each memory gate having an integral conductive tongue extending above said associated third n+ regions and separated therefrom by a thin layer of insulation, each of said memory gates forming an enhancement type MOSFET with its associated channels, whereby charges may be stored selectively in said memory gates, said charged memory gates being discharged selectively by said tongue, the thickness of said insulating layer between said channel regions and said memory gates being at least 100 Å.

4. An n-channel memory FET according to claim 1, in which the insulator layer which separates said tongue from said transfer region covered by it, is thinner than the insulator layer separating said memory gate from said channel region.

5. An n-channel memory FET according to claim 1, in which said memory gate covers only a first part of said channel region, and in which the second part of said channel region is covered by the control gate but not by said memory gate.

6. An n-channel memory FET according to claim 1, in which said memory gate covers said channel region along its entire length between said source and said drain.

7. An n-channel memory FET according to claim 1, in which said channel region is substantially trapezoidal, and in which the narrow end of the trapezoid adjoins said drain.

* * * * *